(12) United States Patent
Kim et al.

(10) Patent No.: US 6,630,392 B2
(45) Date of Patent: Oct. 7, 2003

(54) METHOD FOR FABRICATING FLASH MEMORY DEVICE

(75) Inventors: Dong Jin Kim, Kyoungki-do (KR); Seung Cheol Lee, Kyoungki-do (KR)

(73) Assignee: Hynix Semiconductor Inc., Ich'on (KR)

( * ) Notice: Subject to any disclaimer, the term of this patent is extended or adjusted under 35 U.S.C. 154(b) by 0 days.

(21) Appl. No.: 10/029,939

(22) Filed: Dec. 31, 2001

(65) Prior Publication Data

US 2003/0003673 A1 Jan. 2, 2003

(30) Foreign Application Priority Data

Jun. 29, 2001 (KR) .......................................... 2001-38549

(51) Int. Cl.$^7$ ............................................ H01L 21/336
(52) U.S. Cl. ........................ 438/586; 438/257; 438/591; 438/594; 438/595
(58) Field of Search ........................ 438/257–267, 438/585–596; 257/314–326

(56) References Cited

U.S. PATENT DOCUMENTS

| 5,445,980 | A | * | 8/1995 | Komori et al. ............. 257/321 |
| 5,596,214 | A | | 1/1997 | Endo |
| 5,619,052 | A | * | 4/1997 | Chang et al. ............... 438/251 |
| 5,780,336 | A | * | 7/1998 | Son ............................. 700/121 |
| 5,812,403 | A | * | 9/1998 | Fong et al. .................. 438/719 |
| 6,020,237 | A | | 2/2000 | Shrivastava et al. |
| 6,074,914 | A | | 6/2000 | Ogura |
| 6,096,604 | A | | 8/2000 | Cha et al. |
| 6,133,602 | A | | 10/2000 | Shrivastava et al. |
| 6,232,185 | B1 | | 5/2001 | Wang |
| 6,242,362 | B1 | * | 6/2001 | Liu et al. ..................... 438/264 |
| 6,337,246 | B1 | * | 1/2002 | Sobek et al. ................ 438/258 |
| 2002/0052119 | A1 | * | 5/2002 | Van Cleemput ............ 438/710 |

FOREIGN PATENT DOCUMENTS

JP          63269548  A  *  11/1988  ........... H01L/21/90

* cited by examiner

Primary Examiner—Long Pham
Assistant Examiner—Marcos D. Pizarro-Crespo
(74) Attorney, Agent, or Firm—Jacobson Holman PLLC

(57) ABSTRACT

A method for fabricating a flash memory device begins with forming in sequence a tunnel oxide layer, a floating gate, an oxide-nitride-oxide (ONO) layer, a control gate, and a hard mask nitride layer on a silicon substrate. The hard mask nitride layer, the control gate, the ONO layer, and the floating gate are then patterned in sequence. Next, a sealing nitride layer is formed on a lateral side of the patterned structure. Also, in order to form a spacer, a first insulating layer is deposited on an entire resultant structure and then selectively patterned. Thereafter, second, third and fourth insulating layers are formed in sequence on the entire resultant structure including the spacer, and a photo resist pattern is then formed on the fourth insulating layer to define a metal contact area.

21 Claims, 5 Drawing Sheets

METHOD FOR FABRICATING FLASH MEMORY DEVICE

BACKGROUND OF THE INVENTION

1. Field of the Invention

The present invention relates to a method for fabricating a semiconductor memory device in general, and in particular, to a method for fabricating a flash memory device having a tunnel oxide layer with improved characteristics.

2. Description of the Prior Art

Generally, a flash memory device is one of the types of nonvolatile semiconductor memory devices. The flash memory device combines advantages of an erasable programmable read-only memory (EPROM) device with the advantages of an electrically erasable programmable read-only memory (EEPROM) device.

Such a flash memory device can realize a storage state of one bit by means of one transistor, and perform electrical programming and erasing. The flash memory device having the above characteristics includes a thin tunnel oxide layer formed on a silicon substrate, and a floating gate and a control gate stacked in layers between which an insulating layer is interposed.

However, as the flash memory device is reduced in size, the need for a tungsten gate electrode with low resistance is increased in the art. The use of tungsten for the gate electrode has the drawback that tungsten exposed to an oxidation process shows a rapid oxidizing reaction causing explosion (?)/enlargement(?) of the circuit pattern. In order to prevent such abnormal oxidation of tungsten, a sealing nitride layer should be additionally formed as a means of anti-oxidation, or selective oxidation should be performed only to the underlying polysilicon except tungsten.

In relation to the above, a conventional method for fabricating a flash memory device is described hereinafter with reference to FIGS. 1 to 3.

Referring to FIG. 1, on a cell region (A) of a silicon substrate 1, a tunnel oxide layer 3a, a polysilicon layer 5 for a floating gate, an oxide-nitride-oxide (ONO) layer 7, a polysilicon layer 9 for a control gate, a tungsten or tungsten nitride layer 11, and a hard mask nitride layer 13 are deposited in sequence.

In addition, on a cell peripheral region (B), a low voltage or high voltage gate oxide layer 3b, the polysilicon layer 9 for the control gate, the tungsten or tungsten nitride layer 11, and a hard mask nitride layer 13 are formed simultaneously with those of the cell region (A).

Then, the above-mentioned layers are selectively patterned to form respectively gate patterns on the cell region (A) and the cell peripheral region (B) Here, etching progress in the cell region (A) is stopped at the ONO layer 7.

Thereafter, a first selective oxidation process is performed in order to relieve etching damage of the low voltage or high voltage gate oxide layer 3b on the cell peripheral region (B). As a result, a selective oxidized layer 9a is formed on a lateral side of the polysilicon layer 9 for the control gate.

Next, while the cell peripheral region (B) is covered with a photo resist pattern (not shown), the ONO layer 7 and the polysilicon layer 5 for the floating gate on the cell region (A) are selectively patterned.

Subsequently, in order to relieve etching damage of the tunnel oxide layer 3a, a second selective oxidation process is carried out. A second selective oxidized layer 9b is therefore formed on a lateral side of the polysilicon layer 5 for the floating gate.

Next, a sealing nitride layer 15 for anti-oxidation is deposited over an entire resultant structure. The sealing nitride layer 15 is then, as shown in FIG. 2, anisotropically etched all through the cell region (A) and the cell peripheral region (B). Thus, a sealing nitride pattern 15a for anti-oxidation is formed into a spacer shape.

Thereafter, as shown in FIG. 3, the cell peripheral region (B) is covered with a photo resist pattern (not shown) and the cell region (A) is subjected to selective etch. By selectively etching the polysilicon layer 5 for the floating gate and the ONO layer 7 to expose a surface of the tunnel oxide layer 3a, a polysilicon pattern 5a and an ONO pattern 7a are therefore formed with a predetermined shape.

Though it is not shown in the drawings, a source and a drain are then formed in a surface of the cell region (A) of the silicon substrate 1 by implanting ions such as boron or arsenic.

The flash memory device is completed after a thermal process, a spacer-forming process, and the like are performed.

The above-described conventional method has drawbacks as follows. In the conventional method, the selective oxidation process is performed twice. The first selective oxidation process is performed to relieve etching damage to the low voltage or high voltage gate oxide layer 3b on the cell peripheral region (B). Also, the second selective oxidation process is performed to relieve etching damage of the tunnel oxide layer 3 after the layers on the cell region (A) are selectively patterned using a gate pattern mask.

Since the conventional selective oxidation process is carried out in a hydrogen-rich atmosphere, supplied hydrogen gas is often transferred to the gate oxide layer or the tunnel oxide layer. Unfortunately, such transferred hydrogen gas is trapped in the oxide layer, thus producing a trap site.

That is, the influx of hydrogen causes the characteristics of the oxide layer to be affected very seriously in the nonvolatile devices such as flash memory devices.

SUMMARY OF THE INVENTION

It is therefore an object of the present invention to provide an improved method for fabricating a flash memory device having a tunnel oxide layer with excellent characteristics by performing only a single normal oxidation process during metal contact etching.

This and other objects are attained by a method for fabricating a flash memory device in accordance with the present invention. The method begins with the step of sequentially forming a tunnel oxide layer, a floating gate, an oxide-nitride-oxide (ONO) layer, a control gate, and a hard mask on a silicon substrate. The hard mask, the control gate, the ONO layer, and the floating gate are then sequentially patterned. Next, an insulating layer is formed on the entire resultant structure, and a contact hole is formed in the insulating layer in order to expose a portion of the silicon substrate. Thereafter, oxidation is performed on the entire resultant structure including the contact hole.

According to another aspect of the present invention, a method for fabricating a flash memory device begins with forming in sequence a tunnel oxide layer, a floating gate, an oxide-nitride-oxide (ONO) layer, a control gate, and a hard mask nitride layer on a silicon substrate. The hard mask nitride layer, the control gate, the ONO layer, and the floating gate are then patterned in sequence. Next, a sealing nitride layer is formed on a lateral side of the patterned structure. Also, in order to form a spacer, a first insulating layer is deposited on the entire resultant structure and then selectively patterned. Thereafter, second, third and fourth insulating layers are formed in sequence on the entire resultant structure including the spacer, and a photo resist pattern is then formed on the fourth insulating layer in order to define a metal contact area. Next, the fourth, third and second insulating layers are selectively patterned through the photo resist pattern, so that a contact hole is formed exposing a portion of the silicon substrate. Also, oxidation is performed on the entire resultant structure including the contact hole.

DETAILED DESCRIPTION OF THE INVENTION

The present invention will be now described more fully hereinafter with reference to accompanying drawings, in which preferred embodiments of the invention are shown. This invention may, however, be embodied in many different forms and should not be construed as limited to the embodiments set forth herein.

A method for fabricating a flash memory device according to an embodiment of the present invention is illustrated from FIG. 4 to FIG. 9.

Figure 1:
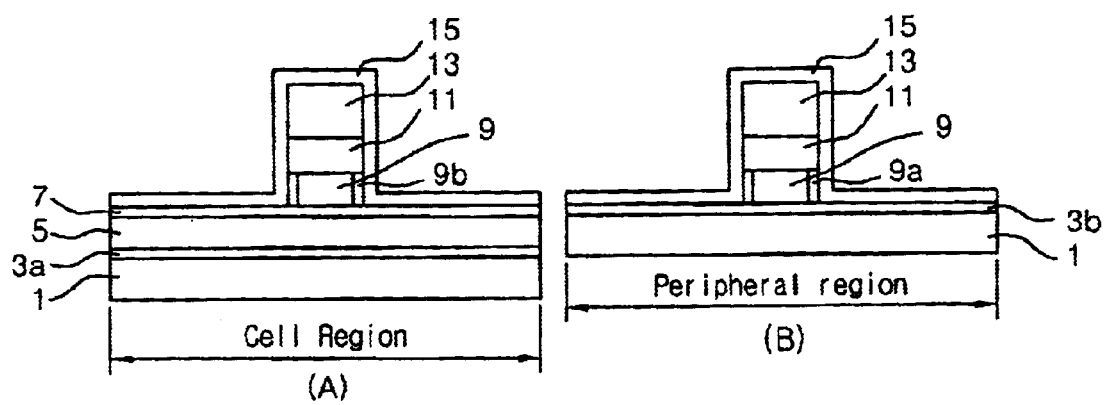
FIGS. 1 to 3 are cross-sectional views showing a conventional method for fabricating a flash memory device.
Figure 2:
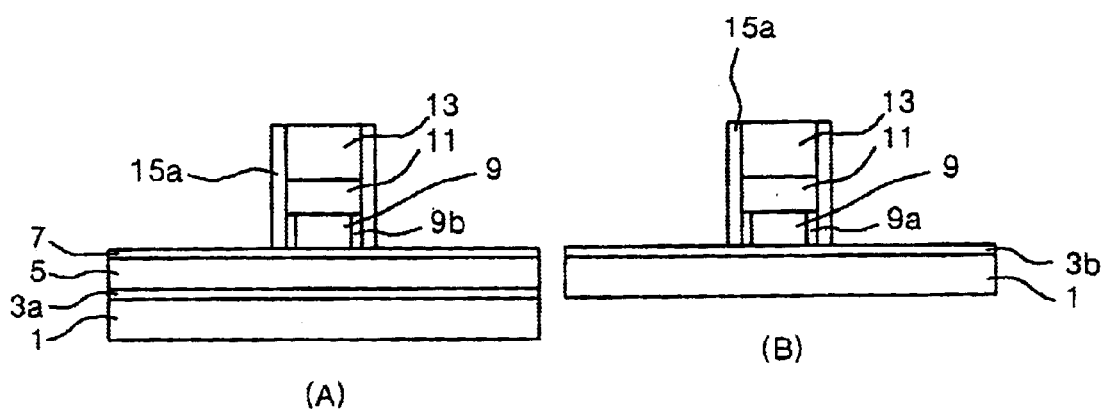
Figure 3:
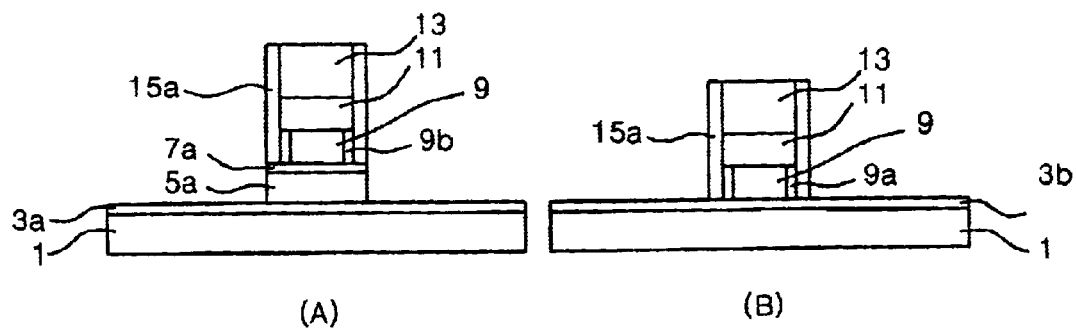
Figure 4:
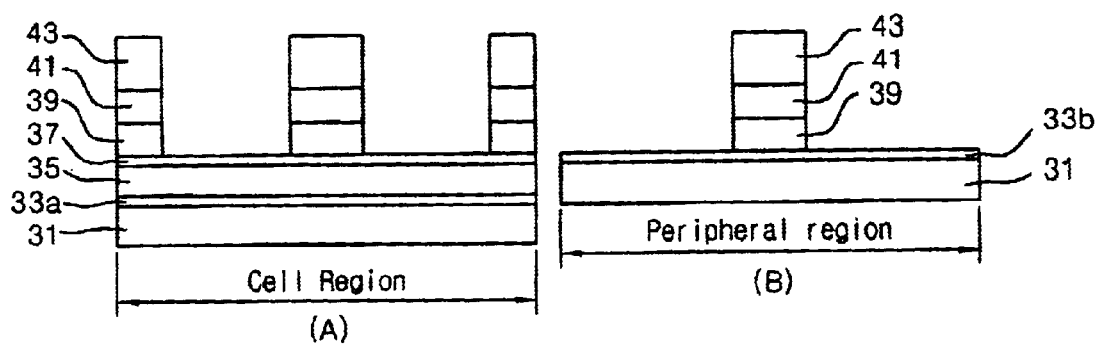
FIGS. 4 to 9 are cross-sectional views showing a method for fabricating a flash memory device according to an embodiment of the present invention.

Referring to FIG. 4, on a cell region (A) of a silicon substrate 31, a tunnel oxide layer 33$a$, a first polysilicon layer 35 for a floating gate, an oxide-nitride-oxide (ONO) layer 37, a second polysilicon layer 39 for a control gate, a tungsten or tungsten nitride layer 41, and a hard mask nitride layer 43 are deposited in sequence.

In addition, on a cell peripheral region (B), a low voltage or high voltage gate oxide layer 33$b$, the second polysilicon layer 39 for the control gate, the tungsten or tungsten nitride layer 41, and a hard mask nitride layer 43 are formed simultaneously with those of the cell region (A).

The above-mentioned layers are then selectively patterned to form respectively gate patterns on the cell region (A) and the cell peripheral region (B) Here, etching progress in the cell region (A) is stopped at the ONO layer 37. According to the conventional method, a selective oxidation process in a hydrogen-rich atmosphere follows to relieve damage in subsequent gate etching. However, the method of the present invention does not require such a selective oxidation process.

Figure 5:
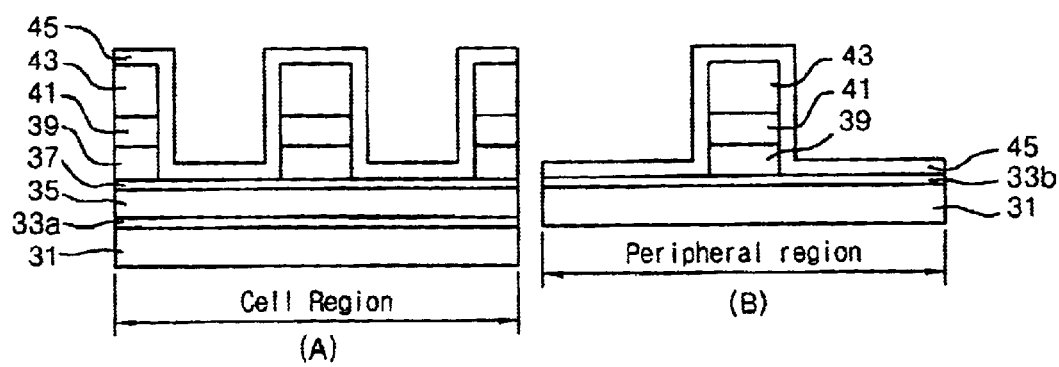
Figure 6:
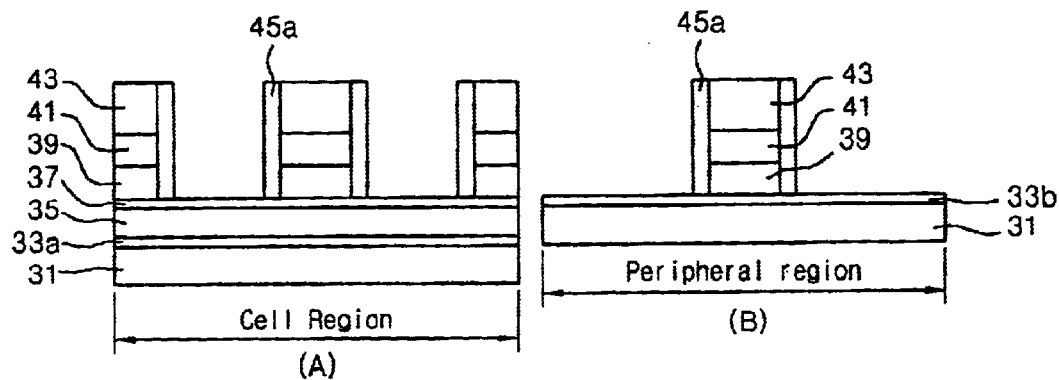

Now referring to FIGS. 5 and 6, a sealing nitride layer 45 is formed on the entire resultant structure in order to prevent the oxidation of tungsten in subsequent processes. The sealing nitride layer 45 is then patterned to form a sealing nitride pattern 45$a$. Thereafter, an LDD region (not shown) is formed in the silicon substrate 31 under each side of the gate pattern of the cell peripheral region (B) by using LDD or DDD implantation. Here, the sealing nitride pattern 45$a$ serves as a screen from implantation damage in the LDD implantation. The sealing nitride pattern 45$a$ has preferably a thickness of about 20~130 Å.

Figure 7:
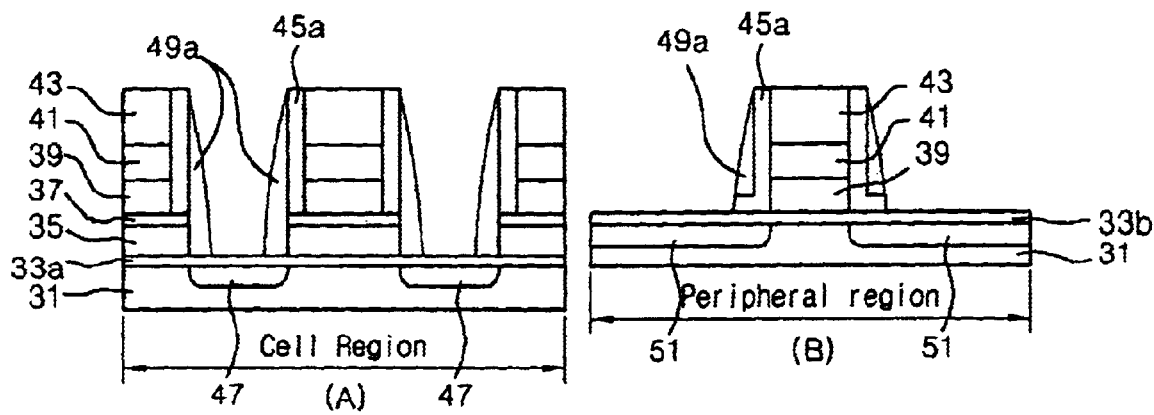

Next, as shown in FIG. 7, while the patterned hard mask nitride layer 45 on the cell region (A) is used as a mask, the ONO layer 37 and the first polysilicon layer 35 for the floating gate are selectively patterned. Then, by performing source/drain implantation toward the cell region (A) only, a source/drain 47 is formed in the silicon substrate 31 under each side of the gate pattern of the cell region (A). Here, the conventional method would employ another selective oxidation process to prevent etching damage of the tunnel oxide layer 33$a$.

Thereafter, a nitride layer for a spacer 49$a$ is deposited on the entire resultant structure. The nitride layer is then selectively patterned together with the sealing nitride layer 45. As a result, the nitride spacer 49$a$ is formed on sidewalls of the cell region (A) and the cell peripheral region (B) Preferably, the nitride spacer 49$a$ has a thickness of about 300~1800 Å.

Figure 8:
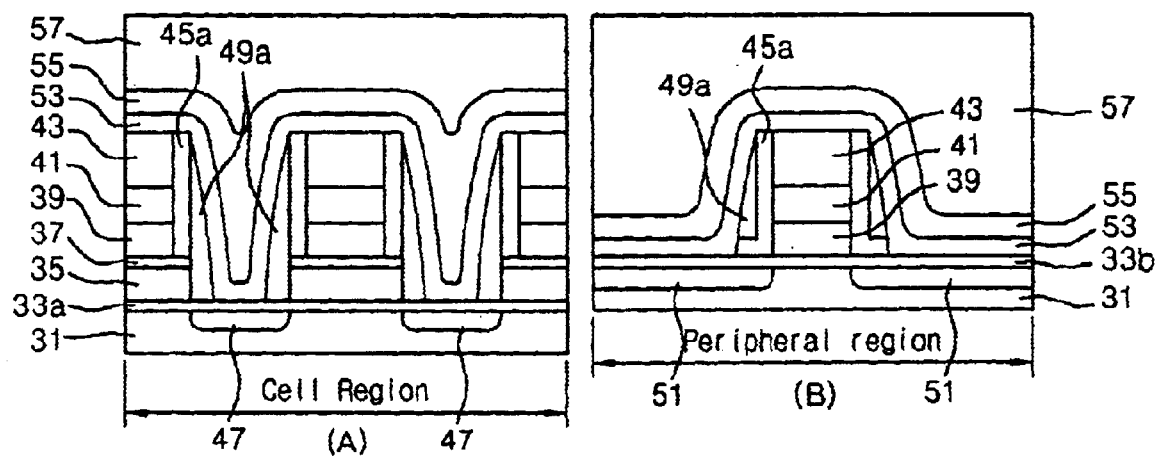

Next, as shown in FIG. 8, another source/drain 51 is formed in the silicon substrate 31 under each side of the gate pattern of the cell peripheral region (B). Subsequently, another nitride layer 53, an inter-poly oxide (IPO) layer 55, and a boro-phosphorus silicate glass (BPSG) layer 57 are deposited in sequence on the entire resultant structure including the cell peripheral region (B). The BPSG layer 57 is then flowed.

Preferably, the nitride layer 53 has a thickness of about 100~700 Å, and the deposition thickness of the IPO layer 55 is about 500~3500 Å. In addition, the BPSG layer 57 has a thickness of about 4000~14000 Å, a deposition temperature of 750~875θ C., and a deposition time of 5~75 minutes.

Next, the BPSG layer 57 is coated with a photo resist layer (not shown). The photo resist layer is then selectively patterned by means of photolithography technology, so that a contact hole area is defined by a photo resist pattern (not shown).

Figure 9:
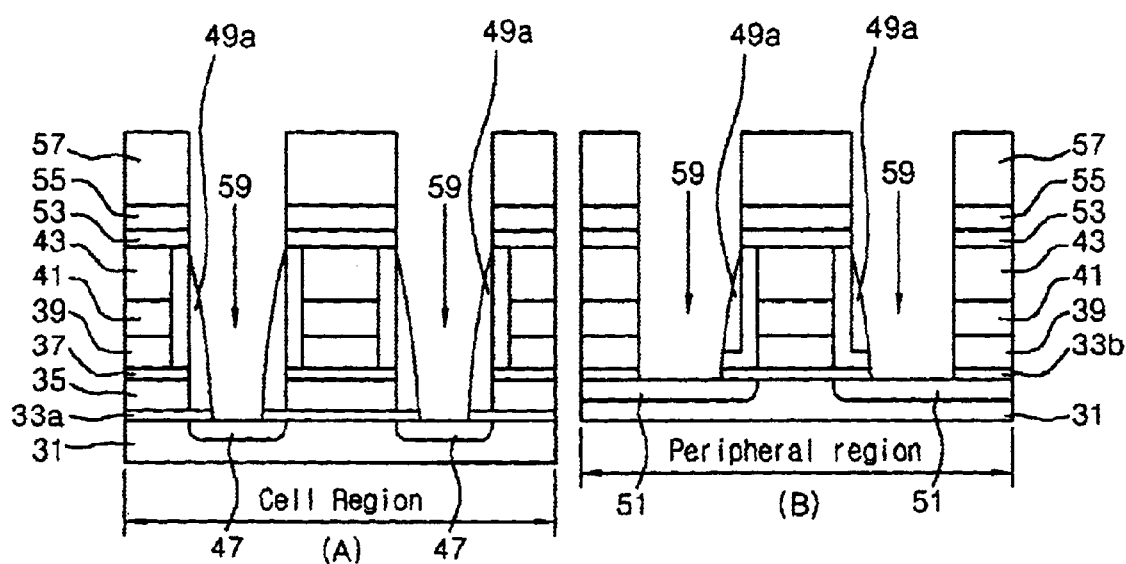

Now referring to FIG. 9, while the photo resist pattern (not shown) is used as a mask, the BPSG layer 57, the IPO layer 55 and the nitride layer 53 are then sequentially patterned to form metal contact holes 59 exposing the source/drain 47 and 51.

Thereafter, to form an undercut in the under part of the nitride spacer 49$a$, a wet cleaning process follows. Preferably, the wet cleaning process uses a hydrogen fluoride (HF) solution of 50~100:1 or a buffered oxide etch (BOE) solution of 100~300:1 for 10~150 seconds before a subsequent oxidation process.

Next, a plug implantation process is performed to compensate for losses of source/drain implant dose due to the loss of the silicon substrate 31 probably occurring in the metal contact etching process.

Moreover, an oxidation process is then carried out to compensate for etching damage to the tunnel oxide layer 33$a$ on the cell region (A) and the low voltage or high voltage gate oxide layer 33$b$ on the cell peripheral region (B) thereby to guarantee excellent characteristics.

The oxidation process is performed at a temperature of 750~1000θ C. and a pressure of 0.1~760 Torr. Oxygen gas is supplied at a flow rate of 5~20 SLM, and an oxidation thickness is set to cover 20~300 Å as a monitoring thickness.

Additionally, a loading temperature in the oxidation process is regulated at 300~600θ C., and a nitrogen flow rate in loading ranges of 2~30 SLM. Also, a ramping rate of major oxidation temperature maintains 1~100θ C./minute.

After the oxidation process and before a deposition process of Ti/TiN, a cleaning process is performed. Preferably, the cleaning process uses a HF solution of 50~100:1 or a BOE solution of 100~300:1 for 10~150 seconds.

When the contact holes 59 are established, the BPSG layer 57, the IPO layer 55 and the nitride layer 53 are sequentially etched. As a result, an oxide layer may remain in an active area of the substrate 31 or the loss of the substrate 31 due to over-etching may occur. During a subsequent oxidation process, oxidizing gas can move smoothly through the undercut in the under part of the nitride spacer 49a. Therefore, etching damage is relieved in the tunnel oxide layer 33a or the low voltage or high voltage gate oxide layer 33b.

Consequently, it is possible to form a strong oxide sidewall. Also, preventing the influx of hydrogen in the oxidation process may remove the cause of the deterioration of the tunnel oxide layer or the gate oxide layer.

As fully described hereinbefore, a method for fabricating a flash memory device according to the present invention has at least the following advantages and effects.

In the gate etching process, the tunnel oxide layer or the gate oxide layer is often damaged by etching. Such etching damage is relieved in the oxidation process after metal contact etching, so that oxidation for lowering energy is simplified.

Furthermore, the oxide layer obtained by the normal oxidation process of the present invention has better characteristics than the conventional oxide layer formed by the twice-selective oxidation process. This results because there is no possibility that a trap site is produced in the oxide layer by hydrogen.

In addition, the present invention can substitute the oxidation process for a rapid thermal process conventionally used for dose activation after plug implantation. Accordingly, the number of steps in the whole process is decreased and thereby the production cost is reduced.

On the other hand, according to the reduction in design rule, the formation of a surface channel PMOS is unavoidable. Here, boron ions implanted into a PMOS area may be penetrated into a channel via the gate oxide layer during the high-temperature process for selective oxidation. This may result in unexpected degradation in characteristics of the gate oxide layer. However, the present invention substitutes only a single normal oxidation process for the conventional high temperature selective oxidation process performed twice. This can therefore increase stability to boron penetration and lead to the easy setup of transistors.

In the drawings and specification, there have been disclosed typical preferred embodiments of the invention. Although specific terms are employed, they are used in a generic and descriptive sense only and not for purposes of limitation, the scope of the invention being set forth in the following claims.

What is claimed is:

1. A method for fabricating a flash memory device, comprising the steps of:
   forming in sequence a tunnel oxide layer, a floating gate, an oxide-nitride-oxide (ONO) layer, a control gate, and a hard mask nitride layer on a silicon substrate;
   patterning in sequence the hard mask nitride layer, the control gate, the ONO layer, and the floating gate;
   forming a sealing nitride layer on a lateral side of the patterned structure to obtain a resultant structure;
   forming a spacer by depositing a first insulating layer on the entire resultant structure and then selectively patterning the first insulating layer;
   forming in sequence second, third and fourth insulating layers on the entire resultant structure including the spacer;
   forming a photo resist pattern on the fourth insulating layer in order to define a metal contact area;
   forming a contact hole exposing a portion of the silicon substrate by selectively patterning the fourth, third and second insulating layers through the photo resist pattern; and
   performing oxidation on the entire resultant structure including the contact hole.

2. The method of claim 1, further comprising the step of:
   performing a wet cleaning for 10~150 seconds by using a solution selected from the group consisting of a hydrogen fluoride (HF) solution of 50~100:1 or a buffered oxide etch (BOE) solution of 100~300:1 before the step of performing oxidation.

3. The method of claim 1, wherein the spacer has a thickness of about 300~1800 Å.

4. The method of claim 1, further comprising the step of:
   performing a plug implantation in order to compensate for losses of source/drain implant dose after the step of forming the contact hole.

5. The method of claim 1, wherein the oxidation is performed at a temperature of 750~1000θ C. and a pressure of 0.1~760 Torr by supplying oxygen gas at a flow rate of 5~20 SLM.

6. The method of claim 1, wherein in the oxidation step the oxidation is formed in a thickness of about 20~300 Å.

7. The method of claim 1, wherein the oxidation is performed at a loading temperature of 300~600θ C., a nitrogen flow rate of 2~30 SLM in loading, and a ramping rate of 1~100θ C./minute.

8. The method of claim 1, further comprising the step of:
   performing a cleaning for 10~150 seconds by using a solution selected from the group consisting of a hydrogen fluoride (HF) solution of 50–100:1 and a buffered oxide etch (BOE) solution of 100~300:1 after the step of performing oxidation.

9. The method of claim 1, wherein the spacer and the second insulating layer are respectively nitride layers, wherein the third insulating layer is an oxide layer including inter-poly oxide (IPO), and wherein the fourth insulating layer is a boro-phosphorus silicate glass (BPSG) layer.

10. The method of claim 9, wherein the second insulating layer has a thickness of about 100–700 Å, wherein the IPO layer has a thickness o about 500–3500 Å, and wherein the BPSG layer has a thickness of about 4000–14000 Å.

11. The method of claim 9, wherein the BPSG layer is formed at a deposition temperature of 750~875θ C. and a deposition time of 5~75 minutes.

12. A method for fabricating a flash memory device, comprising the steps of:
   sequentially forming a tunnel oxide layer, a floating gate, an oxide-nitride-oxide (ONO) layer, a control gate, and a hard mask on a silicon substrate;
   sequentially patterning the hard mask, the control gate, the ONO layer, and the floating gate to obtain a resultant structure;
   forming an insulating layer on the entire resultant structure;
   forming a contact hole in the insulating layer in order to expose a portion of the silicon substrate; and
   performing oxidation on the entire resultant structure including the contact hole, wherein the oxidation is performed at a temperature of 750–1000° C. and a pressure of 0.1–760 Torr by supplying oxygen gas at flow rate of 5–20 SLM.

13. The method of claim 12, further comprising the step of:

performing a wet cleaning for 10~150 seconds by using a solution chosen from the group consisting of a hydrogen fluoride (HF) solution of 50~100:1 and a buffered oxide etch (BOE) solution of 100~300:1 before the step of performing oxidation.

14. The method of claim 12, further comprising the step of:

performing a plug implantation in order to compensate for losses of source/drain implant dose after the step of forming the contact hole.

15. The method of claim 12, wherein in the oxidation step the oxidation is formed in a thickness of about 20~300 Å.

16. The method of claim 12, wherein the oxidation is performed with a loading temperature of 300~600θ C., a nitrogen flow rate of 2~30 SLM in loading, and a ramping rate of 1~100θ C./minute.

17. The method of claim 12, further comprising the step of:

performing a cleaning for 10~150 seconds by using a solution selected from the group consisting of a hydrogen fluoride (HF) solution of 50~100:1 and a buffered oxide etch (BOE) solution of 100~300:1 after the step of performing oxidation.

18. The method of claim 12, wherein the insulating layer is composed of stacked first, second, third, and fourth layers, the first and second layers of which are nitride layers, the third layer of which is an oxide layer including inter-poly oxide (IPO), and the fourth layer of which is a borophosphorus silicate glass (BPSG) layer.

19. The method of claim 18, wherein the first nitride layer has a thickness of about 300~1800 Å.

20. The method of claim 18, wherein the second nitride layer has a thickness of about 100~7000 Å, wherein the IPO layer has a thickness of about 500~3500 Å, and wherein the BPSG layer has a thickness of about 4000~14000 Å.

21. The method of claim 18, wherein the BPSG layer is formed at a deposition temperature of 750~875θ C. and a deposition time of 5~75 minutes.

* * * * *